(12) United States Patent
Kim et al.

(10) Patent No.: US 10,663,499 B2
(45) Date of Patent: May 26, 2020

(54) POWER DETECTION CIRCUIT FOR TRACKING MAXIMUM POWER POINT OF SOLAR CELL AND METHOD THEREOF

(71) Applicant: Korea University Research and Business Foundation, Seoul (KR)

(72) Inventors: Chul Woo Kim, Seoul (KR); Jun Young Maeng, Seoul (KR); Min Seob Shim, Seoul (KR); Jun Won Jeong, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 182 days.

(21) Appl. No.: 15/880,138

(22) Filed: Jan. 25, 2018

(65) Prior Publication Data

US 2019/0072590 A1    Mar. 7, 2019

(30) Foreign Application Priority Data

Sep. 7, 2017  (KR) .................. 10-2017-0114546

(51) Int. Cl.
  *G01R 21/133*  (2006.01)
  *G01R 19/04*  (2006.01)
  (Continued)

(52) U.S. Cl.
  CPC ........... *G01R 21/133* (2013.01); *G01R 19/04* (2013.01); *G01R 19/255* (2013.01);
  (Continued)

(58) Field of Classification Search
  CPC .... G01R 21/133; G01R 19/04; G01R 19/255; G01R 19/257; G01R 19/30; G05F 1/06
  See application file for complete search history.

(56) References Cited

U.S. PATENT DOCUMENTS

6,369,462 B1 * 4/2002 Siri .......................... G05F 1/67
  307/51
9,154,032 B1 * 10/2015 Beijer ...................... G05F 1/67
  (Continued)

*Primary Examiner* — Tung X Nguyen
*Assistant Examiner* — Feba Pothen
(74) *Attorney, Agent, or Firm* — Fox Rothschild LLP (57) ABSTRACT

Provided is a power detection circuit for tracking a maximum power point of a solar cell. The power detection circuit includes: an average voltage extracting unit which extracts an average voltage $V_{PV,LPF}$ from an external voltage $V_{PV}$ input from an external energy source; a ripple voltage extracting unit which extracts a ripple voltage including current information of the external voltage $V_{PV}$ from the external voltage $V_{PV}$; a voltage-time converter which generates a ramp voltage $V_{RAMP}$ changing at a predetermined rate and converts the average voltage $V_{PV,LPF}$ and the ripple voltage into corresponding time information $\Delta t_1$ and $\Delta t_2$ based on the ramp voltage $V_{RAMP}$; a time-digital converter which converts the time information $\Delta t_2$ for the ripple voltage into a digital code $t_2$ [n:0]; and a time multiplier which multiplies the digital code $t_2$ [n:0] and the time information $\Delta t_1$ for the average voltage $V_{PV,LPF}$ to output a specific voltage value.

15 Claims, 11 Drawing Sheets

(51) Int. Cl.
   *G01R 19/255*   (2006.01)
   *G01R 19/257*   (2006.01)
   *G01R 19/30*   (2006.01)
   *G05F 1/67*   (2006.01)

(52) U.S. Cl.
   CPC ............ *G01R 19/257* (2013.01); *G01R 19/30* (2013.01); *G05F 1/67* (2013.01)

(56) References Cited

U.S. PATENT DOCUMENTS

| | | | |
|---|---|---|---|
| 9,270,191 B2* | 2/2016 | Chisenga | H02J 3/383 |
| 9,432,025 B1* | 8/2016 | Khor | H03L 1/00 |
| 2005/0190096 A1* | 9/2005 | Isomura | H03M 1/56 |
| | | | 341/166 |
| 2011/0109346 A1* | 5/2011 | Moussaoui | G05F 1/67 |
| | | | 327/60 |
| 2012/0087159 A1* | 4/2012 | Chapman | H02J 3/383 |
| | | | 363/41 |
| 2014/0055583 A1* | 2/2014 | Kato | H04N 7/01 |
| | | | 348/65 |

* cited by examiner

Power Equation of PV Cell

$$P_{PV} = V_{PV,AVG} \cdot I_{PV,AVG}$$

$$= V_{PV,LPF} \cdot C \cdot \frac{dV}{dT}$$

$$= V_{PV,LPF} \cdot (V_{S2} - V_{S1}) \cdot \frac{C}{T} \quad (1)$$

(a)

V-T Conversion

$$\Delta t_1 = \frac{V_{PV,LPF}}{V_{PEAK}} \cdot T_{RAMP} \quad (2)$$

$$\Delta t_2 = \frac{V_{S2} - V_{S1}}{V_{PEAK}} \cdot T_{RAMP} \quad (3)$$

(b)

Time Multiplication Value $\propto P_{PV}$

$$\Delta t_1 \cdot \Delta t_2 = V_{PV,LPF} \cdot (V_{S2} - V_{S1}) \cdot \left(\frac{V_{RAMP}}{V_{PEAK}}\right)^2 \quad (4)$$

(c)

Number of Stage of Time to Digital Converter

$$\Delta t_2 = N \cdot t_d + \varepsilon \qquad N = \frac{\Delta t_2 - \varepsilon}{t_d} \quad (5)$$

(d)

Time Multiplication (T-V Conversion)

$$V_{TM} = \frac{N \cdot I_{unit}}{C_{\Phi n}} \cdot \Delta t_1 = \frac{I_{unit}}{C_{\Phi n}} \cdot \Delta t_1 \cdot \left(\frac{\Delta t_2 - \varepsilon}{t_d}\right)$$

$$\approx \frac{I_{unit}}{C_{\Phi n}} \cdot \Delta t_1 = \frac{I_{unit}}{C_{\Phi n} \cdot t_d} \cdot \left(\frac{T_{RAMP}}{V_{PEAK}}\right)^2 \cdot V_{PV,LPF} \cdot (V_{S2} - V_{S1}) \quad (6)$$

|  | VLSI 2013(a) | ISSCC 2015(b) | TCAS-I 20147(c) | Present invention(d) |
|---|---|---|---|---|
| Technology | 0.18um | 0.18um | 0.18um | 0.18um |
| Converter type | Capacitive | Capacitive | Inductive | Inductive |
| MPPT type | Backward | Backward | Backward | Backward |
| Output dependence | Dependent | Dependent | Independent | Independent |
| Input range | 0.3 – 0.6 | 0.45 – 3 | 0.4 – 1.7 | 1 – 2.4 |
| Throughput power | < 5uW | < 50uW | < 670uW | < 47uW |
| Tracking efficiency | 94.6% | N/A | 83% @ 200lux. | 97.9% |
| $P_{MPP.CONT}$ | 35uW | 0.4uW | 5.1uW | 0.9uW |

POWER DETECTION CIRCUIT FOR TRACKING MAXIMUM POWER POINT OF SOLAR CELL AND METHOD THEREOF

CROSS-REFERENCE TO RELATED APPLICATIONS

This application claims the priority of Korean Patent Application No. 10-2017-0114546 filed on Sep. 7, 2017, in the Korean Intellectual Property Office, the disclosure of which is incorporated herein by reference.

BACKGROUND

Field

The present disclosure relates to a power detection circuit and a method thereof, and more particularly, to a power detection circuit for tracking a maximum power point of a solar cell appropriate for a low power energy harvesting system and a method thereof.

Description of the Related Art

A power detection circuit is a circuit which is mainly used for a DC-DC converter used in an energy harvesting system and is necessary to extract a maximum power from a natural energy source (for example, light, heat, or vibration) in a specific environmental energy condition.

In recent years, an Internet of things (IoT) market where objects are connected via Internet to exchange information is attracting attention and thus, an interest in a power conversion technique using an energy harvesting technique is increasing. That is, an interest in a power conversion technique for extracting a maximum power from a natural energy (for example, light, heat, and vibration) which is applied to a microwatt level ultra-low power wireless sensor node which becomes a mediator of information exchange between objects is rapidly increasing. Therefore, the power detection circuit is developed in this circumstance.

The power detection circuit operates at very low levels of power and therefore has to have low power consumption. However, in order to detect a power from a device (for example, a solar cell) having a modeling including a non-linear element, both the complicated circuit and a high power consumption are required. Further, in order to detect a power, in the related art, not only a voltage, but also a current needs to be detected. However, a circuit for detecting a current (for example, an operation amplifier or an analog circuit having a high precision) causes high power consumption, so that the circuit is not appropriate for the low power energy harvesting system. Therefore, in order to achieve a better system efficiency, it is necessary to design a power detection circuit consuming a low power for trackingthe maximum power point.

In the meantime, a power monitor using a time-domain technique has been studied to reduce the power consumption of the power detection circuit. The power monitor using the time-domain technique which has been studied till now is classified into a monitor to which a direct power detecting method is applied and a monitor to which an indirect power detecting method is applied. Among these, the time-domain power monitor to which the indirect power detection method is applied is dependent on a value of an output voltage and a type of a converter, so that it is difficult to precisely detect a power under various environmental energy conditions. In contrast, the direct power detection type may precisely detect the power regardless of the environmental energy condition. However, the direct-power detection technique based time-domain power monitor circuit of the related art requires a fixed voltage hysteresis window for obtaining time information and also requires an additional calculation such as an energy-time standardization so that a complex digital circuit is required. Therefore, in this case, there is a disadvantage that the power consumption is large, and even though the time-domain technique is used to reduce power consumption, it is not suitable for a low power energy harvesting system such as a sensor node.

SUMMARY

Therefore, an object of the present disclosure is to provide a power detection circuit which is applied with a direct power detecting method and detects a power only using a voltage value without having a circuit for detecting a current to minimize power consumption and a method thereof.

Further, an object of the present disclosure is to provide a power detection circuit which detects a power using a ripple voltage value during a minute interval and an average voltage value through a low-pass filter to minimize power consumption and a method thereof.

Furthermore, an object of the present disclosure is to provide a power detection circuit which converts voltage and current information into time information through a sample and hold of a solar cell output voltage having a triangular waveform to track a maximum power point only using voltage information and a method thereof.

According to an aspect of the present disclosure, there is provided a power detection circuit. The power detection circuit includes an average voltage extracting unit which extracts an average voltage from an external voltage input from an external energy source; a ripple voltage extracting unit which extracts a ripple voltage from the external voltage; a voltage-time converter which generates a ramp voltage changing at a predetermined rate and converts the average voltage and the ripple voltage into corresponding time information based on the ramp voltage; a time-digital converter which converts the time information for the ripple voltage into a digital code; and a time multiplier which multiplies the digital code and the time information for the average voltage and outputs a specific voltage value.

In this case, the average voltage extracting unit may include a low pass filter (LPF) through which the external voltage passes to extract the average voltage.

Further, the ripple voltage extracting unit may include a sample and hold circuit (S/H) which extracts a maximum value and a minimum value of the external voltage by sampling the external voltage.

Further, the voltage-time converter includes a ramp generator which generates the ramp voltage; a first comparator which compares the ramp voltage and the average voltage; a first D flip-flop which synchronizes a result signal of the first comparator with a system clock to output a first pulse wave having time information for the average voltage; a second comparator which compares the ramp voltage with the maximum value of the external voltage; a third comparator which compares the ramp voltage with the minimum value of the external voltage; and a second D flip-flop which synchronizes a result signal of the second and third comparators with the system clock to output a second pulse wave having time information for the ripple voltage.

Further, the voltage-time converter may further include a first switch which controls the ramp voltage to be transmitted to the first comparator; and a second switch which controls the ramp voltage to be transmitted to the second and third comparators, and the first switch and the second switch may oppositely operate to selectively operate the first comparator and the second and third comparators.

Further, the voltage-time converter may further include first and second capacitors which reduce noise when the first and second switches are on/off.

Further, the time multiplier may include n+1 current sources which mirror a current reference; a switch group which includes n+1 switches corresponding to the n+1 current sources one by one and determines a magnitude of a current flowing the time multiplier depending on whether the n+1 switches are on/off; a first capacitor which charges a voltage with a magnitude of the current determined in the switch group; and a third switch which controls connection of the switch group and the first capacitor depending on whether to be on/off. The n+1 switches included in the switch group may be controlled to be on/off by the digital code; and the third switch may be controlled to be on/off by time information for the average voltage.

The time multiplier may further include a second capacitor which is selected alternately with the first capacitor to charge a voltage with a magnitude of a current determined in the switch group; fourth and fifth switches which control the first and second capacitors to be alternately selected on the basis of a specific unit time; and a comparator which compares a voltage charged in the first capacitor and a voltage charged in the second capacitor to output an up-down signal.

According to another aspect of the present disclosure, there is provided a power detecting method of a power detection circuit for tracking a maximum power point of an external voltage input from an external energy source. The power detecting method includes: an average voltage extracting step of extracting an average voltage from an external voltage; a ripple voltage extracting step of extracting a ripple voltage from the external voltage; a ramp voltage generating step of generating a ramp voltage changing at a predetermined rate; a voltage-time converting step of converting the average voltage and the ripple voltage into corresponding time information based on the ramp voltage; a time-digital converting step of converting the time information for the ripple voltage into a digital code; and a time multiplying step of multiplying the digital code and the time information for the average voltage to output a specific voltage value.

In this case, the external energy source may be a solar cell, and the external voltage may have a triangular waveform.

Further, in the average voltage extracting step, the average voltage may be extracted by passing the external voltage through a low pass filter LPF.

Further, in the ripple voltage extracting step, a maximum value and a minimum value of the external voltage may be extracted by sampling the external voltage.

The voltage-time converting step may include a first comparing step of comparing the ramp voltage and the average voltage; a first synchronizing step of synchronizing a result signal of the first comparing step with a system clock to output a first pulse wave having time information for the average voltage; a second comparing step of comparing the ramp voltage with the maximum value of the external voltage; a third comparing step of comparing the ramp voltage with the minimum value of the external voltage; and a second synchronizing step of synchronizing a result signal of the second and third comparing steps with the system clock to output a second pulse wave having time information for the ripple voltage.

Further, the time multiplying step may include determining a magnitude of a current to determine a specific voltage value by the digital code; determining a charging time based on time information for the average voltage; and charging the first capacitor with the determined magnitude of current during the determined time.

Further, the time multiplying step may further include charging the current by alternately selecting the first capacitor and the second capacitor in accordance with the elapse of time; and comparing a voltage charged in the first capacitor and a voltage charged in the second capacitor to output an up-down signal.

According to the power detection circuit and a method thereof of the present disclosure, the power is detected using a ripple voltage value during a minute interval and an average voltage value through a low pass filter so that a power detector may be implemented only by detecting a voltage without detecting a current. Further, according to the present disclosure, voltage and current information are converted into time information through sample and hold of a solar cell output voltage having a triangular waveform to track a maximum power point only by the voltage information. Therefore, the present disclosure may implement a time-domain power monitor with a low power consumption, only by a simple circuit without requesting time-energy standardization or a fixed voltage hysteresis window. Therefore, it is possible to configure an efficient energy harvesting system suitable for an ultra-low power wireless sensor node.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION

In the following detailed description, only certain exemplary embodiments of the present disclosure have been described so that those skilled in the art may easily carry out the present disclosure. As those skilled in the art would realize, the described embodiments may be modified in various different ways, all without departing from the spirit or scope of the present disclosure. In the meantime, the drawings and description are to be regarded as illustrative in nature and not restrictive. Like reference numerals designate like elements throughout the specification. Further, even though a detailed description is omitted, if those skilled in the art may easily understand the description, the description will be omitted.

In the specification and the claim, unless explicitly described to the contrary, the word "comprise" and variations such as "comprises" or "comprising", will be understood to imply the inclusion of stated elements but not the exclusion of any other elements.

Figure 1:
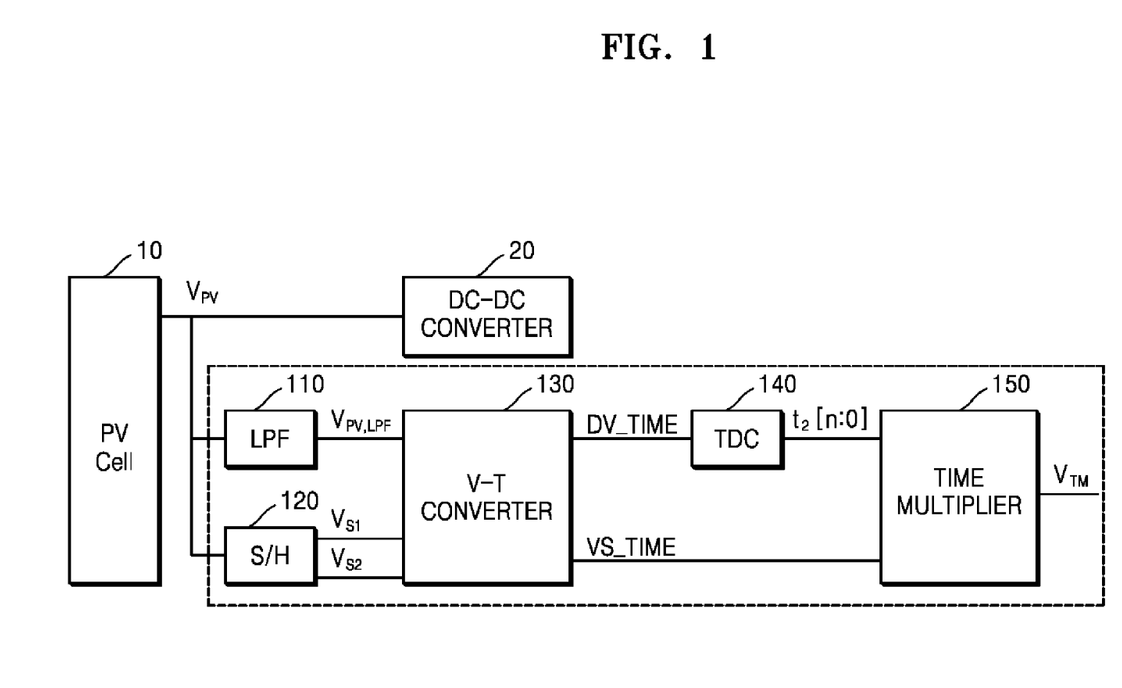
FIG. 1 is a schematic block diagram of a power detection circuit.

FIG. 1 is a schematic block diagram of a power detection circuit. In an example of FIG. 1, a power detection circuit 100 operates based on a direct power detecting method and operates in response to a voltage $V_{PV}$ input from a solar cell (PV cell) 10 which is an external energy source. That is, the power detection circuit 100 illustrated in FIG. 1 operates to detect a power of the voltage $V_{PV}$ input from the solar cell (PV cell) 10.

Referring to FIG. 1, the power detection circuit 100 of the present disclosure includes a low pass filter (LPF) 110, a sample and hold circuit (S/H) 120, a voltage-time converter (V-T converter) 130, a time-digital converter (T-D converter) 140, and a time multiplier 150.

The low pass filter (LPF) 110 obtains an average voltage $V_{PV,LPF}$ from an external voltage $V_{PV}$ having a triangular waveform.

The sample and hold circuit (S/H) 120 extracts a ripple voltage including current information of the external voltage $V_{PV}$ from the external voltage $V_{PV}$. That is, since the power detection circuit 100 of the present disclosure tracks the power by detecting only the voltage, the sample and hold circuit (S/H) 120 performs sampling on the external voltage $V_{PV}$ having a triangular waveform and then obtains a maximum value $V_{S2}$ and a minimum value $V_{S1}$ of the external voltage $V_{PV}$.

Figure 9:
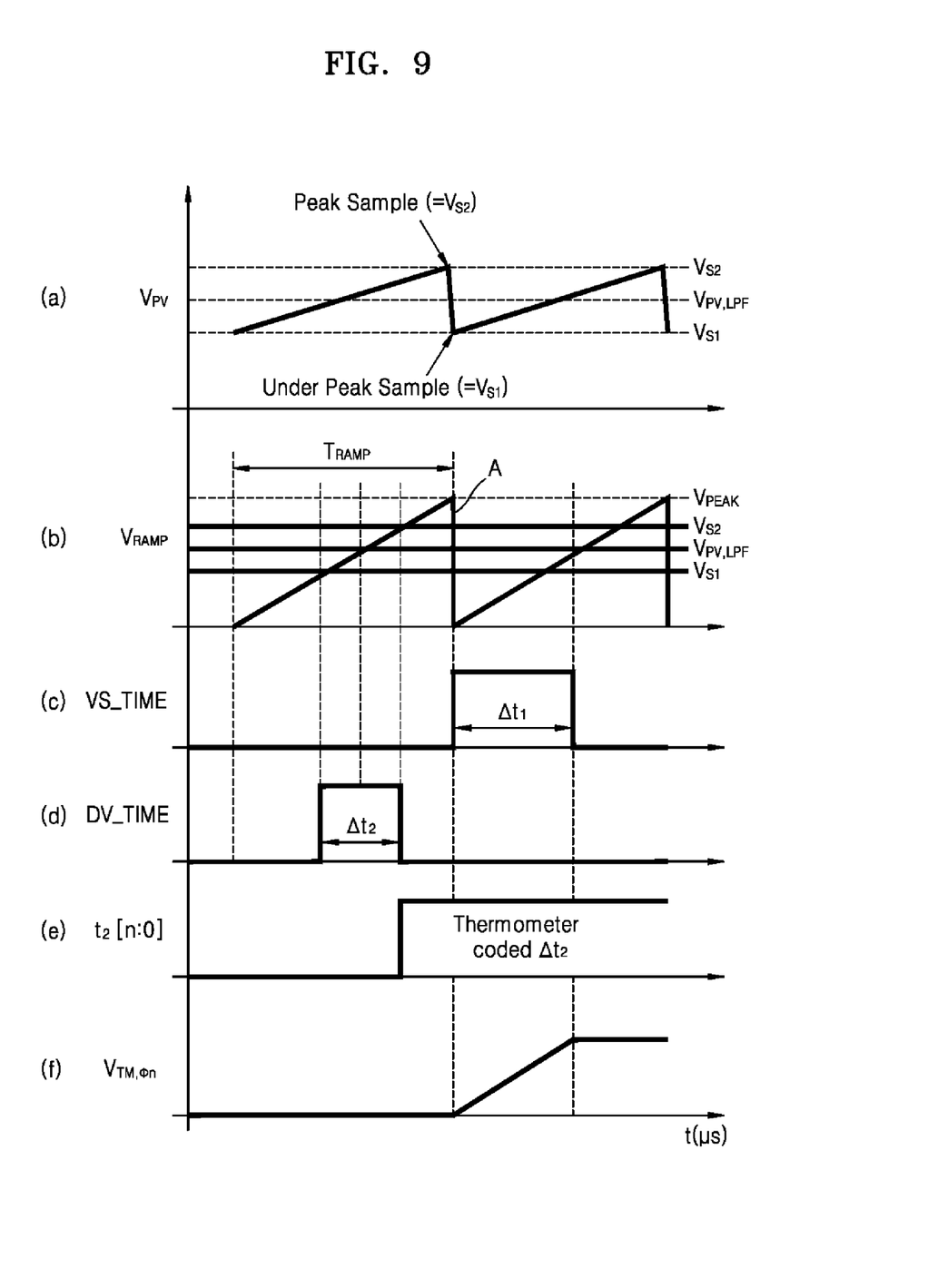
FIG. 9 is a view illustrating waveforms generated during a process of tracking a maximum power point by a power detection circuit and a method thereof.

In the meantime, FIG. 9 is a view illustrating waveforms generated during a process of tracking a maximum power point by a power detection circuit and a method thereof. In FIG. 9A, an external voltage $V_{PV}$ having a triangular waveform, an average voltage $V_{PV,LPF}$ value obtained by passing the external voltage $V_{PV}$ through the low pass filter LPF 110, a maximum value (peak sample) $V_{S2}$ and a minimum value (under peak sample) $V_{S1}$ of the external voltage $V_{PV}$ obtained by sampling the external voltage $V_{PV}$ are represented.

Figure 2:
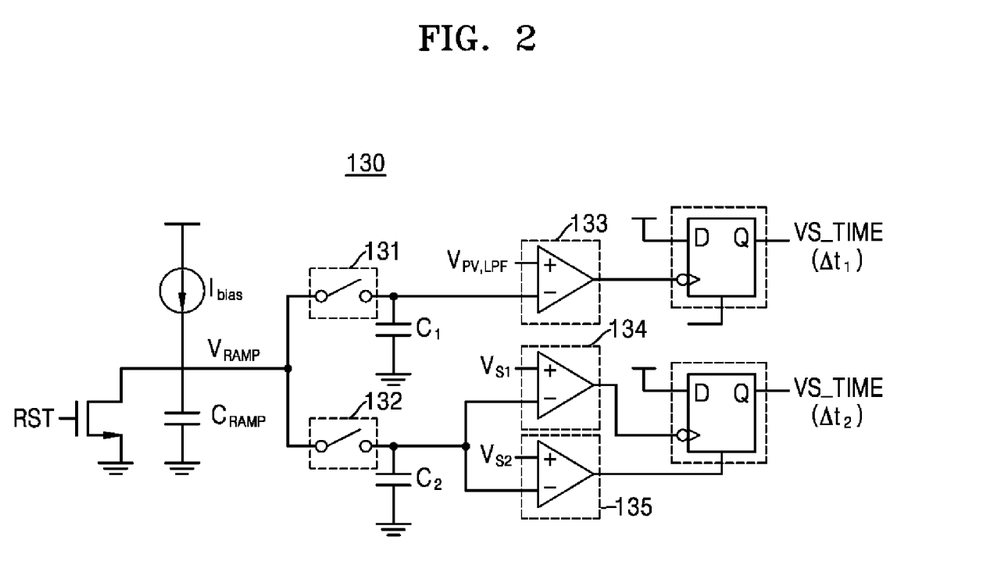
FIG. 2 is a circuit diagram of a voltage-time converter (V-T converter).

Referring to FIG. 1 again, the voltage-time converter 130 converts an input voltage value into time information to detect a power at a time domain. For example, the voltage-time converter (V-T converter) 130 receives the average voltage $V_{PV,LPF}$ output from the low pass filter (LPF) 110 and the maximum value $V_{S2}$ and the minimum value $V_{S1}$ of the external voltage $V_{PV}$ output from the sample and hold circuit (S/H) 120 as inputs to convert the inputs into corresponding time information $\Delta t_1$ and $\Delta t_2$ and output the converted time information. To this end, the voltage-time converter 130 is configured as illustrated in FIG. 2 and generates an independent ramp signal $V_{RAMP}$ and compares the average voltage $V_{PV,LPF}$ and the maximum value $V_{S2}$ and the minimum value $V_{S1}$ of the external voltage $V_{PV}$ with the ramp signal $V_{RAMP}$, respectively. A specific operation of the voltage-time converter 130 will be mentioned again in description with reference to FIG. 2. The ramp signal $V_{RAMP}$ A, the average voltage $V_{PV,LPF}$, and the maximum value $V_{S2}$ and the minimum value $V_{S1}$ of the external voltage $V_{PV}$ are illustrated in FIG. 9B and examples of the time information $\Delta t_1$ and $\Delta t_2$ generated by the comparison result are illustrated in FIGS. 9C and 9D. That is, FIG. 9C illustrates a pulse wave VS_TIME having the time information $\Delta t_1$ for the average voltage and FIG. 9D illustrates a pulse wave DV_TIME having the time information $\Delta t_2$ for the ripple voltage.

Figure 3:
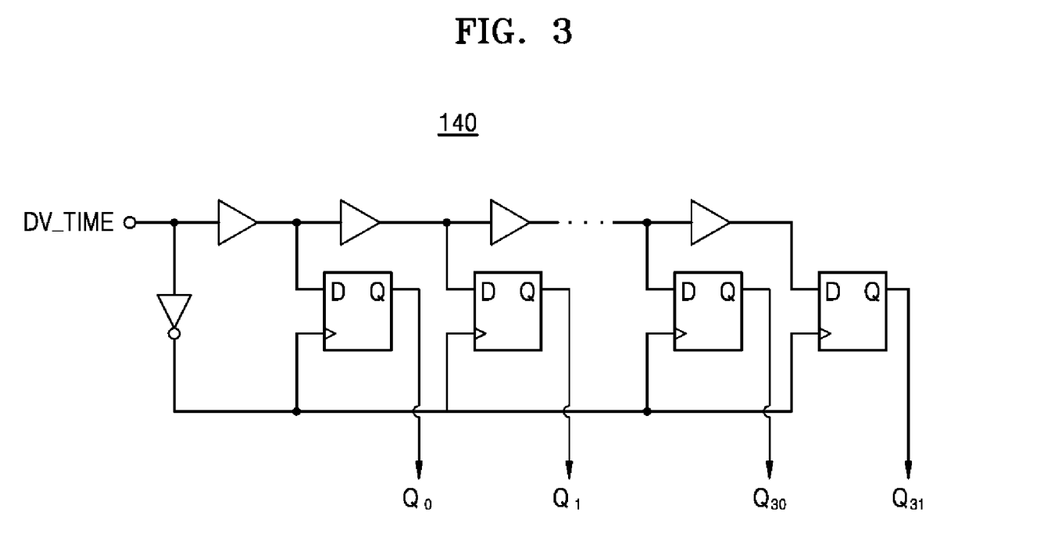
FIG. 3 is a circuit diagram of a time-digital converter (T-D converter).

The time-digital converter 140 converts the input time information into a digital code. That is, the time-digital converter receives the pulse wave DV_TIME having the time information $\Delta t_2$ for the ripple voltage from the voltage-time converter 130 and converts the pulse wave into a digital code $t_2$ [n:0] and output the digital code. To this end, the time-digital converter 140 may be implemented by multistage D flip-flops as illustrated in FIG. 3. In this case, a series of processes of generating the digital code $t_2$ [n:0] from the pulse wave DV_TIME having the time information $\Delta t_2$ for the ripple voltage using the circuit of FIG. 3 may be performed using a known technique. In the meantime, in an example of FIG. 1, the time-digital converter 140 outputs (n+1) bits of digital code. However, the present disclosure is not limited to (n+1) bits. That is, a high n value or a low n value may be applied depending on the time-digital converter 140. In FIG. 9E, an example of the digital code $t_2$ [n:0] output from the time-digital converter 140 is illustrated.

Figure 4:
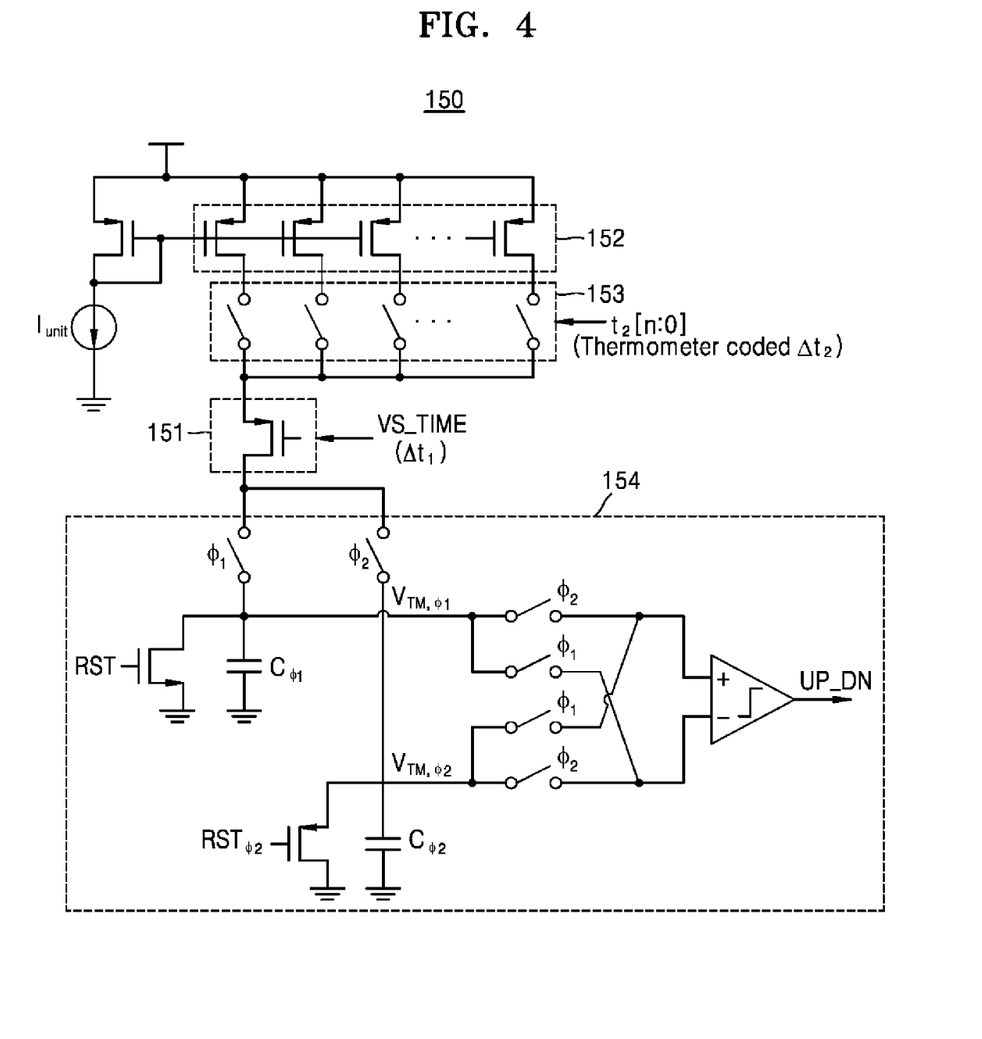
FIG. 4 is a circuit diagram of a time multiplier.

The time multiplier 150 converts a value which is converted into a digital code in the time-digital converter 140 into analog voltage information and outputs the converted analog voltage information. Further, the time multiplier 150 compares the generated analog voltage with a previous analog voltage to detect the power. To this end, the time multiplier 150 is configured as illustrated in FIG. 4 and multiplies the digital code $t_2$ [n:0] and the time information $\Delta t_1$ to output a specific voltage value. In this case, the digital code $t_2$[n:0] determines a magnitude of a current for determining the specific voltage value and the time information $\Delta t_1$ determines a charging time. A specific operation of the time multiplier 150 will be mentioned again in description with reference to FIG. 4. In FIG. 9F, an example of a voltage value $V_{TM,\phi n}$ obtained by multiplying the digital code $t_2$[n:0] and the time information $\Delta t_1$ is illustrated.

In the meantime, the DC-DC converter 20 illustrated in FIG. 1 is provided to receive a power from the solar cell $V_{PV}$ to supply the power to a circuit having a different voltage level and is necessary for verification of the power detection circuit 100.

As described above, when an external voltage $V_{PV}$ having a triangular waveform as illustrated in FIG. 9A is input, the power detecting circuit 100 of the present disclosure extracts a ripple voltage value during a minute interval and an average voltage value (see FIG. 9B) based on the external voltage $V_{PV}$, converts the ripple voltage value and the average voltage value into time information (see FIGS. 9C and 9D), and then obtains a voltage value $V_{TM}$ (see FIG. 9F) through the time-digital converter 140 and the time multiplier 150. The voltage $V_{TM}$ represents the relative magnitude of power in various environment energy conditions.

FIG. 2 is a circuit diagram of a voltage-time converter (V-T converter) and illustrates a detailed configuration of the voltage-time converter 130 illustrated in FIG. 1.

Referring to FIG. 2, the voltage-time converter 130 includes a ramp generator, first and second switches 131 and 132, first to third comparators 133 to 135, and first and second D flip-flops 136 and 137.

The ramp generator is to generate a ramp voltage $V_{RAMP}$ which is a reference for converting a voltage into a time and includes a current reference $I_{bias}$, a reset switch which is controlled to be on/off in response to an RST signal, and a capacitor $C_{RAMP}$. In the meantime, an operation principle of the ramp generator is as follows: when the reset switch is off, the current reference $I_{bias}$ is charged in the capacitor $C_{RAMP}$ for a predetermined time, and a voltage of the capacitor $C_{RAMP}$ is discharged through a periodical reset signal RST to generate the ramp voltage $V_{RAMP}$. In this case, the generated ramp voltage $V_{RAMP}$ has a triangular waveform A as illustrated in FIG. 9B.

The first comparator 133 compares the ramp voltage $V_{RAMP}$ and the average voltage $V_{PV,LPF}$ and transmits the comparison result to the first D flip-flop 136. By doing this, the first D flip-flop 136 synchronizes a result signal of the first comparator 133 with a system clock to output a first pulse wave VS_TIME $\Delta t_1$ having time information for the average voltage $V_{PV,LPF}$.

The second comparator 134 and the third comparator 135 compare the ramp voltage $V_{RAMP}$ and the maximum value $V_{S2}$ of the external voltage $V_{PV}$ and compare the ramp voltage $V_{RAMP}$ and the minimum value $V_{S1}$ of the external voltage $V_{PV}$ and transmit the result to the D flip-flop 137. By doing this, the second D flip-flop 137 synchronizes the result signals of the second comparator 134 and the third comparator 135 with a system clock and outputs a second pulse wave DV_TIME $\Delta t_2$ having the time information for the ripple voltage.

In the meantime, the first switch 131 controls the ramp voltage $V_{RAMP}$ to be transmitted to the first comparator 133 and the second switch 132 controls the ramp voltage $V_{RAMP}$ to be transmitted to the second and third comparators 134 and 135. In this case, the first switch 131 and the second switch 132 oppositely operate to selectively operate the first comparator 133 and the second and third comparators 134 and 135. That is, only when the comparators 133 to 134 operate, the ramp voltage $V_{RAMP}$ is applied to the corresponding comparator. The reason is to suppress power consumption due to the continuously turned-on comparators which operate at high speed. The first to third comparators 133 to 135 are synchronized with the first switch 131 and the second switch 132 to perform power gating.

Further, capacitors C1 and C2 having a small capacity are placed in a connection line of the first and second switches 131 and 132 and comparators 133 to 135 at subsequent ends. The reason is to reduce a noise when the first and second switches 131 and 132 are on/off.

FIG. 4 is a circuit diagram of a time multiplier and illustrates a detailed configuration of the time multiplier 150 illustrated in FIG. 1.

Referring to FIG. 4, the time multiplier 150 includes a current reference $I_{UNIT}$, a third switch 151, n+1 current sources 152, a switch group 153 including n+1 switches, and a voltage value storing and comparing unit 154.

The third switch 151 controls a connection between the switch group 153 and the voltage value storing and comparing unit 154 depending on whether to be on/off. Specifically, the third switch 151 controls the connection of the first or second capacitor $C_{\phi 1}$ or $C_{\phi 2}$ and the switch group 153 which are included in the voltage value storing and comparing unit 154 to store the voltage value. Therefore, it is possible to determine whether to charge depending on the on/off of the third switch 151. However, an on-time of the third switch 151 is determined by the time information $\Delta t_1$ for the average voltage $V_{PV,LPF}$ so that as a result, the time information $\Delta t_1$ for the average voltage $V_{PV,LPF}$ may determine a charging time.

n1 current sources 152 mirror the current reference $I_{UNIT}$.

The switch group 153 includes n+1 switches corresponding to n+1 current sources 152 one by one and determines a current amount in the time multiplier 150 depending on on/off of the switches. That is, the switch group 153 determines a magnitude of the current which is transmitted to the first or second capacitor $C_{\phi 1}$ or $C_{\phi 2}$ depending on the number of switches which are on. For example, when five switches are on, a magnitude of the current which is transmitted to the first or second capacitor $C_{\phi 1}$ or $C_{\phi 2}$ is $I_{UNIT} \times 5$.

In this case, since the n+1 switches included in the switch group 153 are controlled to be on/off by the digital code $t_2[n:0]$, the current amount in the time multiplier 150 is determined by the digital code $t_2[n:0]$.

The voltage value storing and comparing unit 154 includes first and second capacitors $C_{\phi 1}$ and $C_{\phi 2}$, fourth and fifth switches, and a comparator. The first and second capacitors $C_{\phi 1}$ and $C_{\phi 2}$ are alternately selected on the basis of a specific unit time and charges the voltage in accordance with the magnitude of the current determined by the switch group 153. The fourth and fifth switches control the first and second capacitors $C_{\phi 1}$ and $C_{\phi 2}$ to be alternately selected on the basis of the specific unit time. Further, the comparator compares the voltages charged in the first and second capacitors $C_{\phi 1}$ and $C_{\phi 2}$ to compare a current power value and a previous power value and then output an up-down signal UP_DN.

Figure 5:
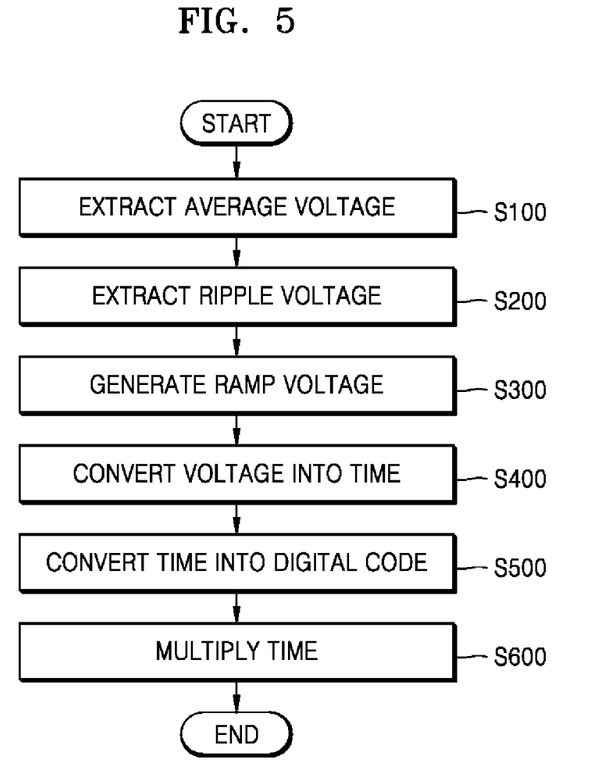
FIG. 5 is a processing flowchart of a power detecting method.

FIG. 5 is a processing flowchart of a power detecting method. Referring to FIGS. 1 and 5, a power detecting method of a power detection circuit 100 of the present disclosure is as follows.

First, a power detection circuit 100 operates based on a direct power detecting method and operates in response to an external voltage $V_{PV}$ input from a solar cell (PV cell) 10 which is an external energy source. That is, the power detection circuit 100 illustrated in FIG. 1 operates to detect a power of the external voltage $V_{PV}$ input from the solar cell (PV cell) 10.

To this end, in step S100, an external voltage $V_{PV}$ having a triangular waveform passes through the LPF 110 to extract an average voltage $V_{PV,LPF}$. In step S200, the S/H 120 extracts a ripple voltage including current information of the external voltage $V_{PV}$ from the external voltage $V_{PV}$. That is, the S/H 120 samples the external voltage $V_{PV}$ to extract a maximum value $V_{S2}$ and a minimum value $V_{S2}$ of the external voltage $V_{PV}$. In FIG. 9A, an external voltage $V_{PV}$ having a triangular waveform, an average voltage $V_{PV,LPF}$ obtained by passing the external voltage $V_{PV}$ through the low pass filter LPF 110, a maximum value (peak sample) $V_{S2}$ and a minimum value (under peak sample) $V_{S1}$ of the external voltage $V_{PV}$ obtained by sampling the external voltage $V_{PV}$ are represented.

In step S300, the V-T converter 130 generates a ramp voltage $V_{RAMP}$ which changes at a predetermined rate. In this case, the ramp voltage $V_{RAMP}$ is a signal which serves as a reference for converting a voltage into a time and has a triangular waveform A as illustrated in FIG. 9B.

As described above, when the ramp voltage $V_{RAMP}$ is generated, in step S400, the V-T converter 130 converts the average voltage $V_{PV,LPF}$ and the ripple voltage into corresponding time information $\Delta t_1$ and $\Delta t_2$ based on the ramp voltage $V_{RAMP}$. To this end, the V-T converter 130 performs a process of comparing the average voltage $V_{PV,LPF}$, the maximum value $V_{S2}$ and the minimum value $V_{S1}$ of the external voltage $V_{PV}$ with the ramp voltage $V_{RAMP}$. A specific process of the V-T converter 130 for performing the voltage-time conversion in step S400 will be mentioned again with reference to FIG. 6. The ramp voltage $V_{RAMP}$ A, the average voltage $V_{PV,LPF}$, and the maximum value $V_{S2}$ and the minimum value $V_{S1}$ of the external voltage $V_{PV}$ are illustrated in FIG. 9B and an example of the time information $\Delta t_2$ and $\Delta t_2$ generated by the comparison result is illustrated in FIGS. 9C and 9D. That is, FIG. 9C illustrates a pulse wave VS_TIME having the time information $\Delta t_1$ for the average voltage and FIG. 9D illustrates a pulse wave DV_TIME having the time information $\Delta t_2$ for the ripple voltage.

In step S500, the T-D converter 140 converts the time information $\Delta t_2$ for the ripple voltage into the digital code $t_2[n:0]$. That is, the T-D converter 140 converts the input time information into a digital code. That is, the time-digital converter receives the pulse wave DV_TIME having the time information $\Delta t_2$ for the ripple voltage from the voltage-time converter 130 and converts the pulse wave into a digital code $t_2[n:0]$. In FIG. 9E, an example of the digital code $t_2[n:0]$ output from the time-digital converter 140 is illustrated.

In step S600, the time multiplier 150 multiplies the digital code $t_2[n:0]$ and the time information $\Delta t_1$ for the average voltage $V_{PV,LPF}$ to output a specific voltage value. In this case, the digital code $t_2[n:0]$ determines a magnitude of a current for determining the specific voltage value and the time information $\Delta t_1$ determines a charging time. A specific operation of the time multiplier 150 will be mentioned again in description with reference to FIG. 7. In FIG. 9F, an example of a voltage value $V_{TM,\phi n}$ obtained by multiplying the digital code $t_2[n:0]$ and the time information $\Delta t_1$ is illustrated.

Figure 6:
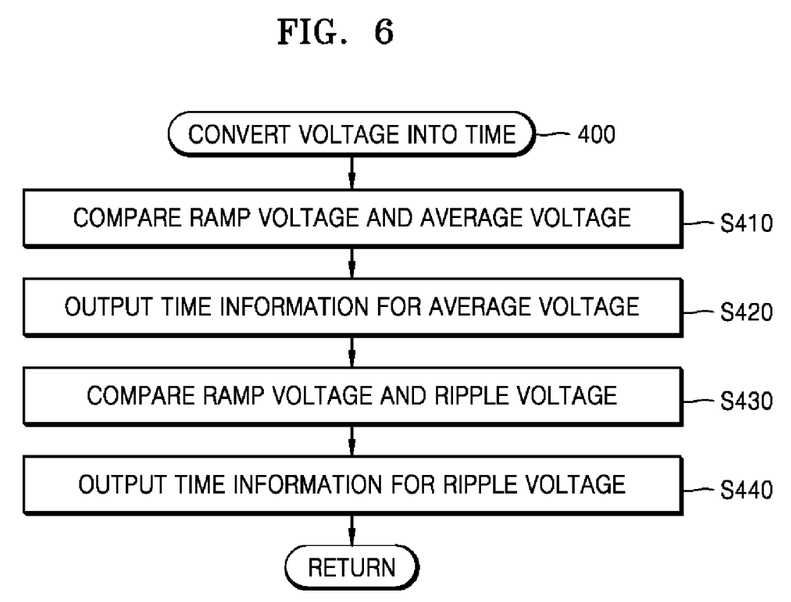
FIG. 6 is a processing flowchart of a voltage-time converting process.

FIG. 6 is a processing flowchart of a voltage-time converting process. Referring to FIGS. 2 and 6, a voltage-time converting process S400 is as follows:

First, in step S410, the first comparator 133 compares the ramp voltage $V_{RAMP}$ and the average voltage $V_{PV,LPF}$ and outputs a result thereof. Thereafter, in step S420, the first D flip-flop 136 synchronizes a result signal of the first comparator 133 with a system clock to output a first pulse wave VS_TIME $\Delta t_1$ having time information for the average voltage $V_{PV,LPF}$.

In step S430, the ramp voltage $V_{RAMP}$ and the ripple voltage are compared. That is, the second comparator 134 compares the ramp voltage $V_{RAMP}$ and the maximum value $V_{S2}$ of the external voltage $V_{PV}$ and the third comparator 135 compares the ramp voltage $V_{RAMP}$ and the minimum value $V_{S1}$ of the external voltage $V_{PV}$.

In step S440, a second D flip-flop synchronizes a comparison result signal of the second and third comparators 134 and 135 with the system clock to output a second pulse wave DV_TIME $\Delta t_2$ having time information for the ripple voltage.

Figure 7:
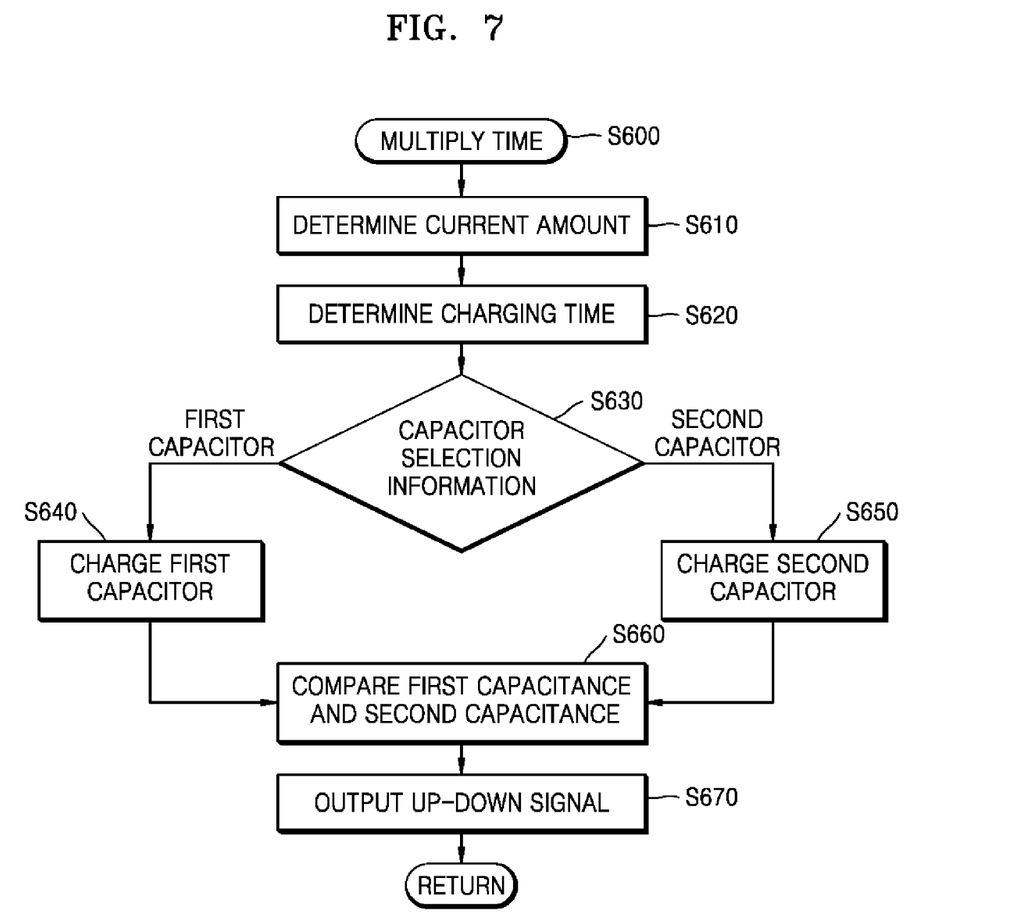
FIG. 7 is a processing flowchart of a time multiplying process.

FIG. 7 is a processing flowchart of a time multiplying process. Referring to FIGS. 4 and 7, a time multiplying process S600 is as follows:

First, in step S610, the switch group 153 determines a current amount in the time multiplier 150 by the digital code $t_2[n:0]$ converted in step S500. That is, the switch group 150 turns on the same number of switches as the number of 1 included in the digital code $t_2[n:0]$, to determine the current amount in the time multiplier 150. That is, the switch group 153 determines a magnitude of the current which is transmitted to the first or second capacitor $C_{\phi 1}$ or $C_{\phi 2}$ depending on the number of switches which are on. For example, when five switches are on based on the number of 1 included in the digital code $t_2[n:0]$, a magnitude of the current which is transmitted to the first or second capacitor $C_{\phi 1}$ or $C_{\phi 2}$ is $I_{UNIT} \times 5$.

Further, in step S620, the third switch 151 determines a charging time based on the time information $\Delta t_1$ for the average voltage $V_{PV,LPF}$. That is, the charging time is determined by determining the on-time of the third switch 151 by the time information $\Delta t_1$.

Further, the voltage value storing and comparing unit 154 determines capacitor selection information in step S630 and charges the corresponding capacitor based on the selection information in step S640 or S650. For example, when the first capacitor $C_{\phi 1}$ is selected in step S630, the voltage value storing and comparing unit charges the first capacitor $C_{\phi 1}$ in step S640 and when the second capacitor $C_{\phi 2}$ is selected in step S630, the voltage value storing and comparing unit charges the second capacitor $C_{\phi 2}$ in step S650. In this case, in step S640 or S650, the voltage is charged with the magnitude of the current determined in step S610 during a time determined in step S620. In the meantime, in step S630, the voltage value storing and comparing unit 154 alternately selects the first capacitor $C_{\phi 1}$ and the second capacitor $C_{\phi 2}$. The reason is to compare current and past charging values. Further, the voltage value storing and comparing unit 154 compares the voltages across a first capacitor and a second capacitor in step S660 and outputs an up-down signal UP_DOWN based on the result in step S670.

Figure 8:
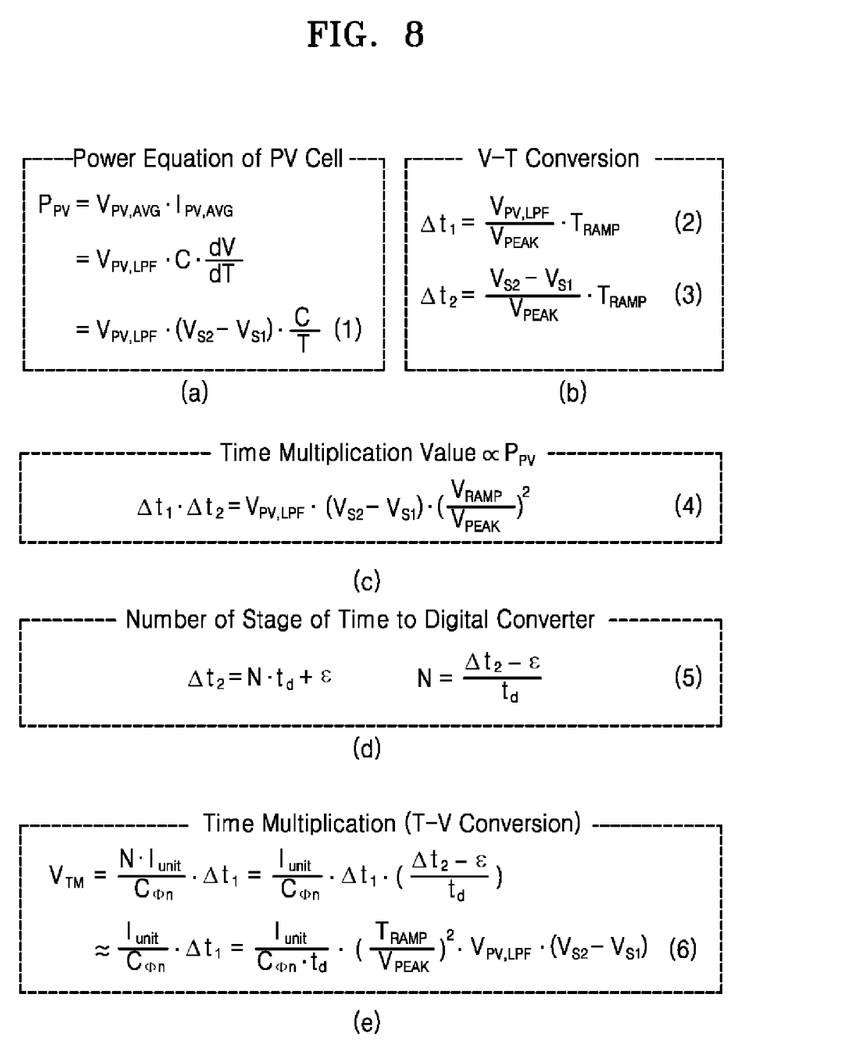
FIG. 8 is a view illustrating equations representing a principle for tracking a maximum power point by a power detection circuit and a method thereof.

FIG. 8 is a view illustrating equations representing a principle for tracking a maximum power point by a power detection circuit and a method thereof.

First, FIG. 8A illustrates a power equation of a solar cell (PV cell). Referring to FIG. 8A, it is understood that a power $P_{PV}$ of the solar cell is represented by a product of the average voltage $V_{PV,LPF}$ and a ripple voltage $V_{S2}-V_{S1}$.

FIG. 8B illustrates Equations 2 and 3 represented by converting the average voltage and the ripple voltage into time information by the voltage-time converter.

FIG. 8C illustrates Equation 4 obtained by multiplying Equations 2 and 3. The value is proportional to Equation 1 which represents the power of the solar cell, which may be established when the capacitance and a period T do not change. Therefore, it is understood that the time information is multiplied to replace the power information.

FIG. 8D is an equation for converting time information of the ripple voltage into a digital code prior to multiplying the time information. That is, the Equation is for calculating a number of stages of time of the digital converter. Further, in FIG. 8D, N indicates the number of delay cells in the digital converter, $t_d$ indicates a delay time of a unit delay cell, and s indicates a quantization error.

FIG. 8E is an equation obtained through the time multiplier of the present disclosure. As seen from the equation of FIG. 8E, it is confirmed that a multiplying function of $\Delta t_1$ and $\Delta t_2$ is successfully performed. Therefore, the proposed circuit can detect the relative magnitude of the power by using only the voltage, which can be expressed through the magnitude of the voltage $V_{TM}$.

Figure 10:
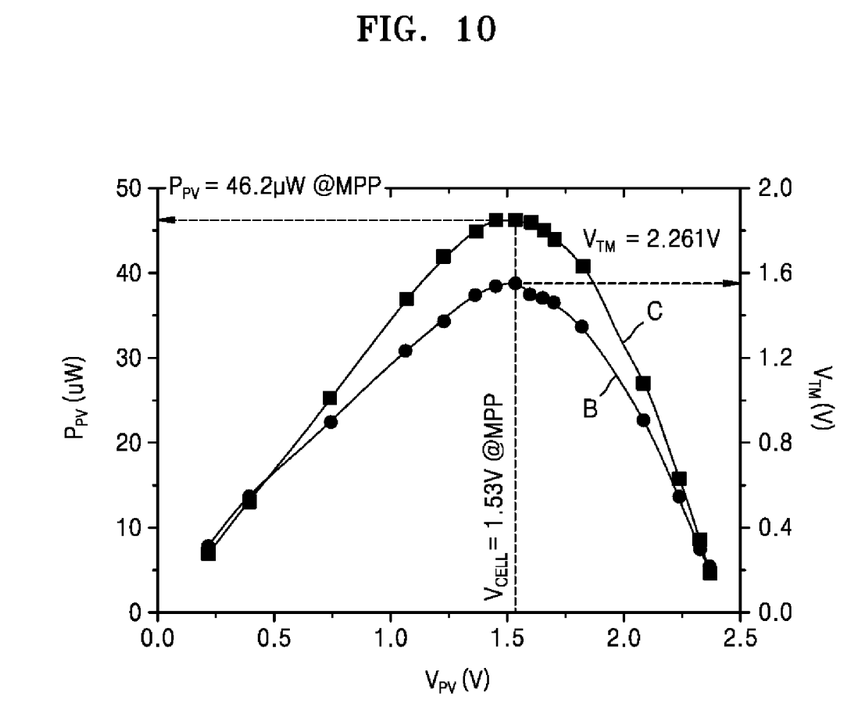
FIG. 10 is a view illustrating a power graph of a solar cell and a simulation result for a power value tracked by the present disclosure.

FIG. 10 is a view illustrating a power graph of a solar cell when illumination is 200 Lux and a simulation result for a power value tracked by the present disclosure. In FIG. 10, a black solid line indicates a power graph of the solar cell and a blue solid line indicates an output of the time multiplier. Referring to FIG. 10, it is understood that the power graph of the solar cell and the voltage $V_{TM}$ of the power detection circuit show the same tendency. Therefore, according to the present disclosure, it can be confirmed that the amount of power can be estimated by using only the voltages.

Figure 11:
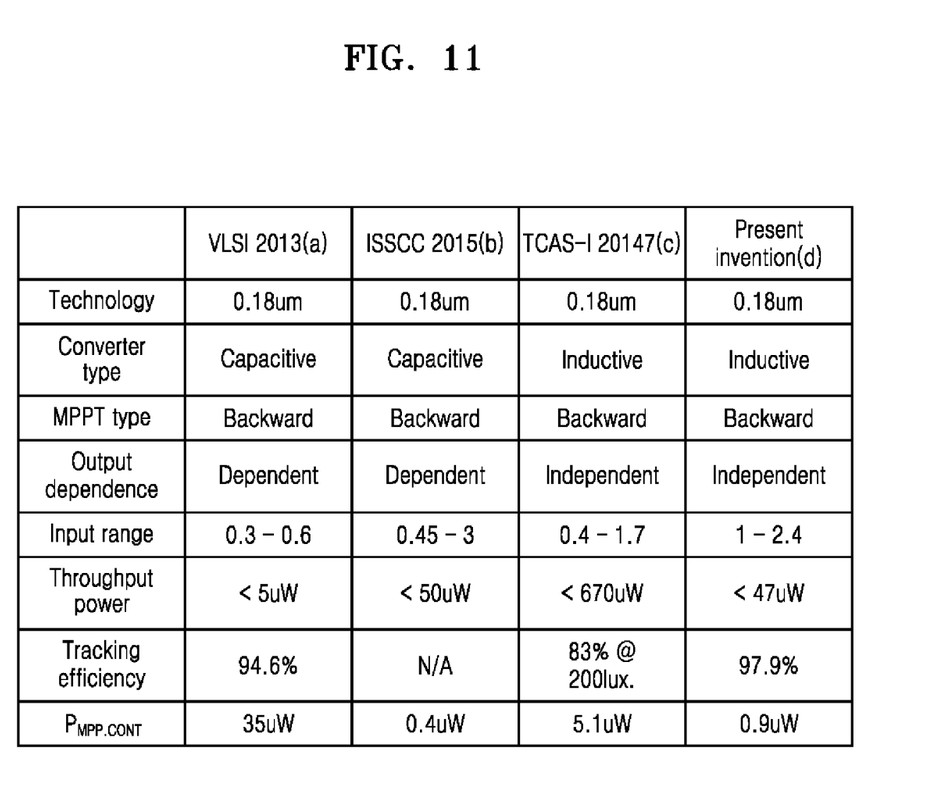
FIG. 11 is a performance comparison table obtained by comparing performances of the present disclosure and the related art.

FIG. 11 is a performance comparison table obtained by comparing performances of the present disclosure and the related art and is a performance comparison table obtained by comparing VLSI 2013 (a), ISSCC 2015 (b), TCAS-I 2017 (c), and the power detection circuit (d) of the present disclosure with respect to eight criteria of a technology, a converter type, an MPPT type, output dependence, an input range, a throughput power, a tracking efficiency, and $P_{MPP, CONT}$.

Referring to FIG. 11, VLSI 2013(a) and ISSCC 2015(b) are capacitively implemented and are dependent on a variation of the output voltage so that it is difficult to precisely track the power.

In the meantime, an inductor type converter is applied to TCAS-I 2017 (d) and MPPT is performed not at an output end of a DC-DC converter, but at an input end so that it is non-dependent on the variation of the output voltage. Therefore, it is possible to more precisely track and detect the power. However, there are disadvantages in that a low tracking efficiency is obtained at a low intensity of light (for example, 200 lux) and power consumption of a circuit for detecting a power is large.

In contrast, according to the present disclosure, there are advantages in that a forward type maximum power point tracking method which is independent on the output is implemented, a high tracking efficiency is obtained, and a power consumption of a circuit for detecting a power is small. Further, according to the present disclosure, as compared with a research paper of TCAS-I 2017 having the same converter type and an independent characteristic, it is understood that the power consumption to detect the power and track the maximum power point of solar cell has been drastically reduced (0.9 µW), and it has a high tracking efficiency (97.9%) at low illumination (200 lux) due to a low power consumption and a high power detection accuracy.

In the above-described exemplary system, even though the methods are described as a series of steps or blocks based on a flowchart, the present disclosure is not limited to sequences of the steps and some steps may be performed in different sequences from the steps described above or simultaneously performed.

Further, those skilled in the art may understand that steps illustrated in the flowchart are not exclusive, other steps may be included therein, or one or more steps of the flowchart may be deleted without affecting the scope of the present disclosure.

What is claimed is:

1. A power detection circuit, comprising:
    an average voltage extracting unit which extracts an average voltage from an external voltage input from an external energy source;
    a ripple voltage extracting unit which extracts a ripple voltage from the external voltage;
    a voltage-time converter which generates a ramp voltage changing at a predetermined rate and converts the average voltage and the ripple voltage into corresponding time information based on the ramp voltage;
    a time-digital converter which converts the time information for the ripple voltage into a digital code; and
    a time multiplier which multiplies the digital code and the time information for the average voltage and outputs a specific voltage value,
    wherein the voltage-time converter includes:
        a ramp generator which generates the ramp voltage;
        a first comparator which compares the ramp voltage and the average voltage;
        a first D flip-flop which synchronizes a result signal of the first comparator with a system clock to output a first pulse wave having time information for the average voltage;
        a second comparator which compares the ramp voltage with the maximum value of the external voltage;
        a third comparator which compares the ramp voltage with the minimum value of the external voltage; and
        a second D flip-flop which synchronizes a result signal of the second and third comparators with the system clock to output a second pulse wave having time information for the ripple voltage.

2. The power detection circuit according to claim 1, wherein the external energy source is a solar cell and the external voltage has a triangular waveform.

3. The power detection circuit according to claim 1, wherein the average voltage extracting unit includes a low pass filter (LPF) through which the external voltage passes to extract the average voltage.

4. The power detection circuit according to claim 1, wherein the ripple voltage extracting unit includes a sample and hold circuit (S/H) which extracts a maximum value and a minimum value of the external voltage by sampling the external voltage.

5. The power detection circuit according to claim 1, wherein the voltage-time converter further includes:
    a first switch which controls the ramp voltage to be transmitted to the first comparator; and
    a second switch which controls the ramp voltage to be transmitted to the second and third comparators; and
    the first switch and the second switch oppositely operate to selectively operate the first comparator and the second and third comparators.

6. The power detection circuit according to claim 5, wherein the voltage-time converter further includes:
    first and second capacitors which reduce a noise when the first and second switches are on/off.

7. The power detection circuit according to claim 1, wherein the time-digital converter includes multi-stage D flip-flops.

8. The power detection circuit according to claim 1, wherein the time multiplier includes:
    n+1 current sources which mirror a current reference;
    a switch group which includes n+1 switches corresponding to the n+1 current sources one by one and determines a magnitude of a current flowing the time multiplier depending on whether the n+1 switches are on/off;
    a first capacitor which charges a voltage with a magnitude of the current determined in the switch group; and
    a third switch which controls connection of the switch group and the first capacitor depending on whether to be on/off,
    the n+1 switches included in the switch group are controlled to be on/off by the digital code and the third switch is controlled to be on/off by time information for the average voltage.

9. The power detection circuit according to claim 8, wherein the time multiplier further includes:
    a second capacitor which is selected alternately with the first capacitor to charge a voltage with a magnitude of a current determined in the switch group;
    fourth and fifth switches which control the first and second capacitors to be alternately selected on the basis of a specific unit time; and a comparator which compares a voltage charged in the first capacitor and a voltage charged in the second capacitor to output an up-down signal.

10. A power detecting method of a power detection circuit for tracking a maximum power point of an external voltage input from an external energy source, the method comprising:
- an average voltage extracting step of extracting an average voltage from an external voltage;
- a ripple voltage extracting step of extracting a ripple voltage from the external voltage;
- a ramp voltage generating step of generating a ramp voltage changing at a predetermined rate;
- a voltage-time converting step of converting the average voltage and the ripple voltage into corresponding time information based on the ramp voltage;
- a time-digital converting step of converting the time information for the ripple voltage into a digital code; and
- a time multiplying step of multiplying the digital code and the time information for the average voltage to output a specific voltage value;
- wherein the voltage-time converting step includes:
  - a first comparing step of comparing the ramp voltage and the average voltage;
  - a first synchronizing step of synchronizing a result signal of the first comparing step with a system clock to output a first pulse wave having time information for the average voltage;
  - a second comparing step of comparing the ramp voltage with a maximum value of the external voltage;
  - a third comparing step of comparing the ramp voltage with a minimum value of the external voltage; and
  - a second synchronizing step of synchronizing a result signal of the second and third comparing steps with the system clock to output a second pulse wave having time information for the ripple voltage.

11. The method according to claim 10, wherein the external energy source is a solar cell and the external voltage has a triangular waveform.

12. The method according to claim 10, wherein in the average voltage extracting step, the average voltage is extracted by passing the external voltage through a low pass filter LPF.

13. The method according to claim 10, wherein in the ripple voltage extracting step, a maximum value and a minimum value of the external voltage are extracted by sampling the external voltage.

14. The method according to claim 10, wherein the time multiplying step includes:
- determining a magnitude of a current to determine a specific voltage value by the digital code;
- determining a charging time based on time information for the average voltage; and
- charging a first capacitor with the determined magnitude of current during the determined time.

15. The method according to claim 14, wherein the time multiplying step further includes:
- charging the current by alternately selecting the first capacitor and a second capacitor in accordance with an elapse of time; and
- comparing a voltage charged in the first capacitor and a voltage charged in the second capacitor to output an up-down signal.

* * * * *